US012729440B2

(12) United States Patent
Matsuura

(10) Patent No.: US 12,729,440 B2
(45) Date of Patent: Sep. 8, 2026

(54) PLASMA PROCESSING APPARATUS AND PLASMA PROCESSING METHOD

(71) Applicant: Tokyo Electron Limited, Tokyo (JP)

(72) Inventor: Hiroyuki Matsuura, Iwate (JP)

(73) Assignee: TOKYO ELECTRON LIMITED, Tokyo (JP)

(*) Notice: Subject to any disclaimer, the term of this patent is extended or adjusted under 35 U.S.C. 154(b) by 327 days.

(21) Appl. No.: 18/218,441

(22) Filed: Jul. 5, 2023

(65) Prior Publication Data

US 2024/0018660 A1 Jan. 18, 2024

(30) Foreign Application Priority Data

Jul. 14, 2022 (JP) ................................ 2022-113291

(51) Int. Cl.

| | |
|---|---|
| ***C23C 16/52*** | (2006.01) |
| ***C23C 16/455*** | (2006.01) |
| ***H01J 37/32*** | (2006.01) |
| ***H10P 72/10*** | (2026.01) |

(52) U.S. Cl.

CPC ........ *C23C 16/52* (2013.01); *C23C 16/45536* (2013.01); *C23C 16/45544* (2013.01); *H01J 37/32091* (2013.01); *H01J 37/32449* (2013.01); *H01J 37/32513* (2013.01); *H01J 37/32568* (2013.01); *H10P 72/12* (2026.01); *H10P 72/14* (2026.01); *H01J 2237/3321* (2013.01)

(58) Field of Classification Search

None

See application file for complete search history.

(56) References Cited

U.S. PATENT DOCUMENTS

| | | | | |
|---|---|---|---|---|
| 6,352,593 | B1 * | 3/2002 | Brors | C23C 16/481 118/724 |
| 2008/0178810 | A1 * | 7/2008 | Koizumi | C23C 16/45574 118/730 |
| 2010/0012273 | A1 * | 1/2010 | Sankarakrishnan | F16K 31/06 156/345.35 |
| 2015/0059648 | A1 * | 3/2015 | Rudolph | F16K 1/226 137/625.46 |
| 2021/0066046 | A1 * | 3/2021 | Oh | C23C 16/45504 |
| 2021/0142988 | A1 * | 5/2021 | Matsuura | H01J 37/32 |

FOREIGN PATENT DOCUMENTS

| | | |
|---|---|---|
| JP | 2007-258580 A | 10/2007 |
| JP | 2008095126 A | 4/2008 |
| JP | 2021077755 A | 5/2021 |
| WO | 2010024334 A1 | 3/2010 |
| WO | 2012131751 A1 | 10/2012 |

* cited by examiner

*Primary Examiner* — Karla A Moore
(74) *Attorney, Agent, or Firm* — Venjuris, P.C.

(57) ABSTRACT

A plasma processing apparatus includes a processing container having an opening in a sidewall, a partition wall configured to cover the opening and to define an internal space communicating with an inside of the processing container, a processing gas supply configured to supply a processing gas to the internal space, a pair of electrodes provided on outer surfaces of opposing sidewalls of the partition wall, and a shutter mechanism configured to open and close a communication hole through which the inside of the processing container communicates with the internal space.

11 Claims, 11 Drawing Sheets

PLASMA PROCESSING APPARATUS AND PLASMA PROCESSING METHOD

CROSS-REFERENCE TO RELATED APPLICATIONS

The present application is based on and claims priority from Japanese Patent Application No. 2022-113291, filed on Jul. 14, 2022, with the Japan Patent Office, the disclosure of which is incorporated herein in its entirety by reference.

TECHNICAL FIELD

The present disclosure relates to a plasma processing apparatus and a plasma processing method.

BACKGROUND

In a vertical type plasma processing apparatus, a technique is known in which a plasma partition wall is provided to cover an opening formed in a sidewall of a processing container and a plasma is generated in an internal space covered with the plasma partition wall (see, e.g., Japanese Patent Laid-Open Publication No. 2007-258580). In Japanese Patent Laid-Open Publication No. 2007-258580, a divider plate is provided to divide between the inside of the processing container and the internal space covered with the plasma partition wall, and to pass a gas containing active species into the processing container.

SUMMARY

A plasma processing apparatus according to one aspect of the present disclosure includes a processing container having an opening in a sidewall, a partition wall configured to cover the opening and to define an internal space communicating with an inside of the processing container, a processing gas supply configured to supply a processing gas to the internal space, a pair of electrodes provided on outer surfaces of opposing sidewalls of the partition wall, and a shutter mechanism configured to open and close a communication hole through which the inside of the processing container communicates with the internal space.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
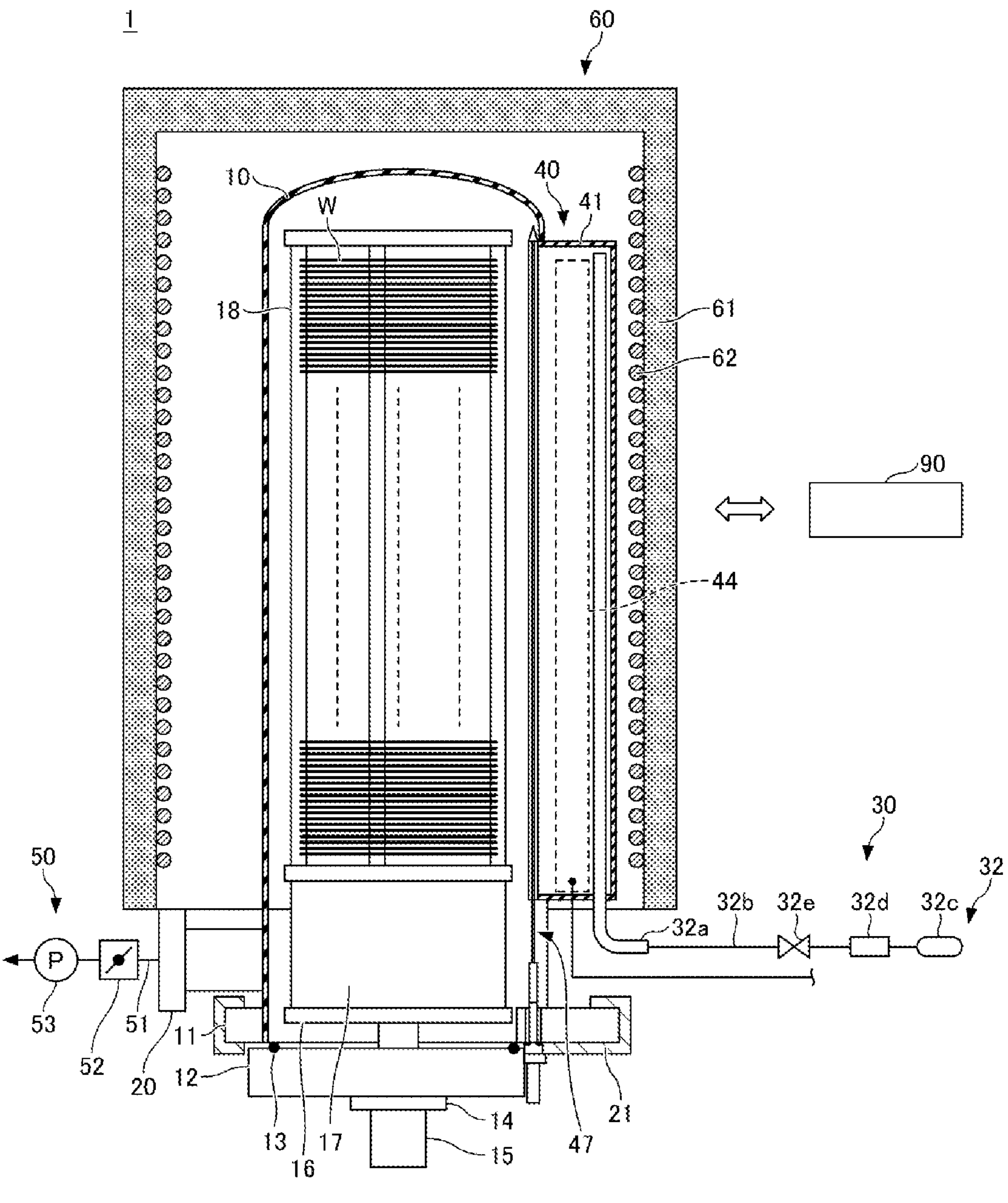
FIG. 1 is a schematic view illustrating a plasma processing apparatus according to an embodiment.
Figure 2:
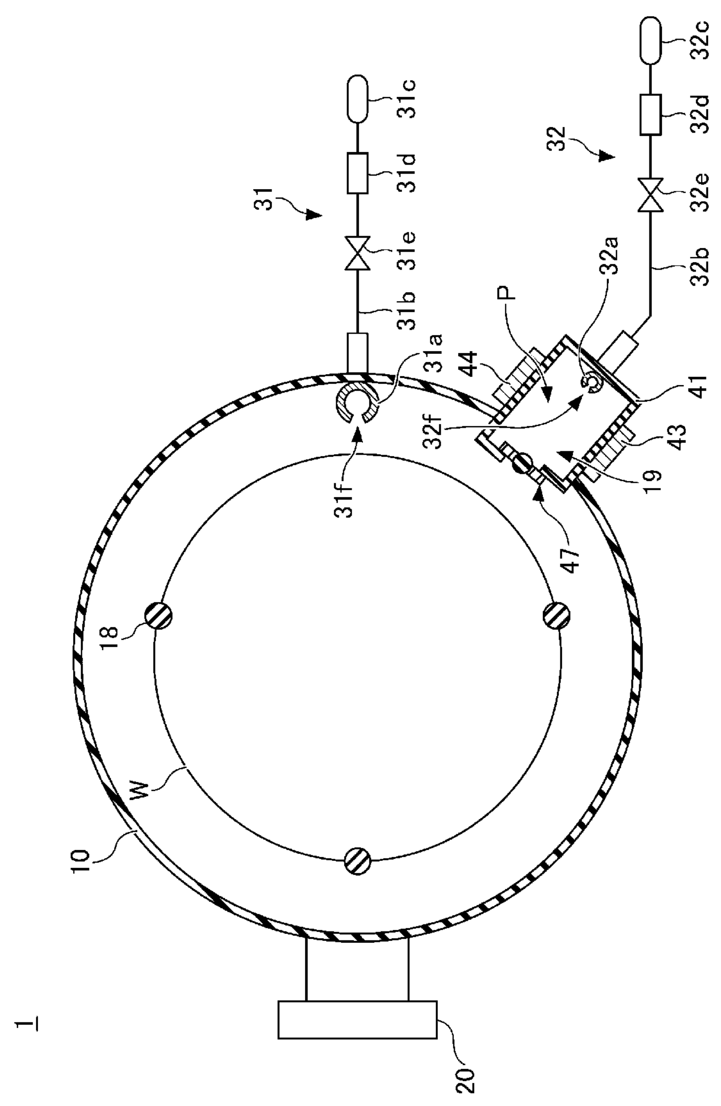
FIG. 2 is a horizontal cross-sectional view illustrating the plasma processing apparatus according to the embodiment.
Figure 3:
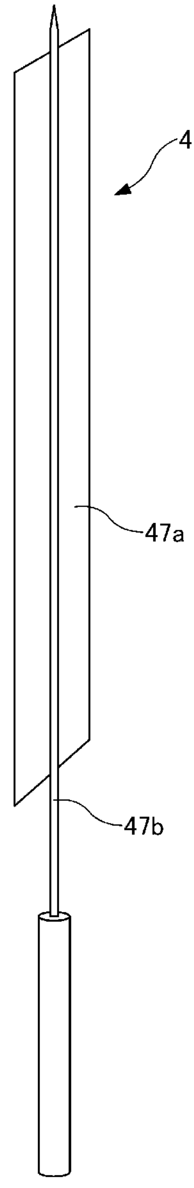
FIG. 3 is a perspective view illustrating an example of a shutter mechanism.
Figure 4:
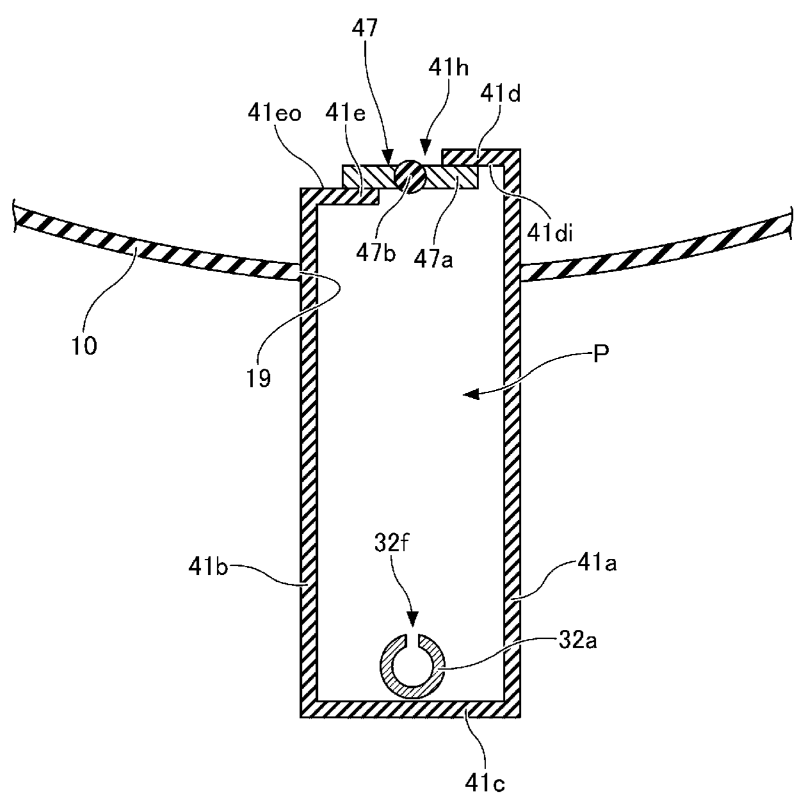
FIG. 4 is a cross-sectional view illustrating the example of the shutter mechanism.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding reference numerals will be given to the same or corresponding members or components, and redundant descriptions thereof will be omitted.

A description related to a plasma processing apparatus 1 according to an embodiment will be made with reference to FIGS. 1 to 10. The plasma processing apparatus 1 is a batch type apparatus that processes a plurality of (e.g., 50 to 200) substrates W at once. The substrates W are, for example, semiconductor wafers such as silicon wafers. The plasma processing apparatus 1 includes a reactor 10, a gas supply 30, a plasma generator 40, an exhauster 50, a heater 60, and a controller 90.

The reactor 10 has a ceilinged cylindrical shape with an open lower end. The inside of the reactor 10 may be depressurized. The reactor 10 functions as a processing container that accommodates therein the plurality of substrates W arranged in multiple tiers. The reactor 10 is made of, for example, quartz.

A bottom flange 11 is formed at the lower end of the reactor 10. The bottom flange 11 is supported by a metal flange 21. The metal flange 21 is provided to sandwich an outer edge of the bottom flange 11 therebetween via a sealing member such as an O-ring (not illustrated). The metal flange 21 is made of, for example, stainless steel. A lid 12 is airtightly attached to a lower surface of the bottom flange 11 via a sealing member 13 such as an O-ring. Thus, an opening at the lower end of the reactor 10 is closed airtightly. The lid 12 is made of, for example, stainless steel. The lid 12 has a recess **12*a* (FIG. 9) indented inward from a part of an outer periphery thereof. The recess 12*a* is formed at a position facing a partition wall 41. The recess 12*a* is provided to prevent interference between the lid 12 and a seal 47*d* to be described later. A rotary shaft 15 is provided through a central portion of the lid 12 via a magnetic fluid seal 14. The rotary shaft 15 is rotatable relative to the lid 12. The lid 12 and the rotary shaft 15 may move up and down relative to the reactor 10. A turntable 16 is provided at an upper end of the rotary shaft 15. A boat 18 is placed on the turntable 16 with a heat insulating cylinder 17 interposed therebetween. The heat insulating cylinder 17 and the boat 18 are made of, for example, quartz. The heat insulating cylinder 17 prevents heat radiation from the opening at the lower end of the reactor 10. The boat 18 is movable up and down integrally with the lid 12. The boat 18 is rotatable integrally with the rotary shaft 15. The boat 18** holds the plurality of substrates W arranged in multiple tiers in the vertical direction.

The reactor 10 has a rectangular opening 19 formed in a sidewall thereof in the longitudinal direction (vertical direction). A length of the opening 19 in the vertical direction is the same as a length of the boat 18, or is formed longer than the length of the boat 18, so as to extend in the vertical direction. The opening 19 is covered with the partition wall 41 to be described later. The partition wall 41 defines an internal space P. The internal space P communicates with the inside of the reactor 10 through the opening 19.

An exhaust port 20 is provided at a lower portion of the sidewall of the reactor The inside of the reactor 10 is evacuated through the exhaust port 20 by the exhauster 50 to be described later.

The gas supply 30 includes a raw material gas supply 31 and a reactant gas supply 32.

The raw material gas supply 31 includes a raw material gas supply pipe 31*a* inserted into and through the reactor 10, and has a raw material gas supply path 31*b* outside the reactor 10. The raw material gas supply path 31*b* is provided with a raw material gas source 31*c*, a mass flow controller 31*d*, and a valve 31*e* in this order from upstream to downstream in the gas flow direction. Thus, the supply timing of a raw material gas from the raw material gas source 31*c* is controlled by the valve 31*e*, and the raw material gas is adjusted to a predetermined flow rate by the mass flow controller 31*d*. The raw material gas is introduced into the raw material gas supply pipe 31*a* from the raw material gas supply path 31*b*, and is discharged into the reactor 10 from the raw material gas supply pipe 31*a*. The raw material gas may be, for example, a metal-containing gas or a silicon-containing gas. An example of the metal-containing gas may include titanium tetrachloride ($TiCl_4$) gas. An example of the silicon-containing gas may include dichlorosilane (DCS) gas.

The reactant gas supply 32 includes a reactant gas supply pipe 32*a* inserted into and through the internal space P, and has a reactant gas supply path 32*b* outside the reactor The reactant gas supply path 32*b* is provided with a reactant gas source 32*c*, a mass flow controller 32*d*, and a valve 32*e* in this order from upstream to downstream in the gas flow direction. Thus, the supply timing of a reactant gas from the reactant gas source 32*c* is controlled by the valve 32*e*, and the reactant gas is adjusted to a predetermined flow rate by the mass flow controller 32*d*. The reactant gas is introduced into the reactant gas supply pipe 32*a* from the reactant gas supply path 32*b*, and is discharged into the internal space P from the reactant gas supply pipe 32*a*. The reactant gas is a gas that reacts with the raw material gas to produce a reaction product, and may be, for example, a nitriding gas. An example of the nitriding gas may include ammonia (NH 3) gas.

Each gas supply pipe (raw material gas supply pipe 31*a* or reactant gas supply pipe 32*a*) is made of, for example, quartz. The raw material gas supply pipe 31*a* extends linearly in the vertical direction near an inner surface of the reactor 10, is bent in an L-shape at a lower portion of the reactor 10, and penetrates a side surface of the reactor 10 to extend to the outside of the reactor 10. The reactant gas supply pipe 32*a* extends linearly in the vertical direction near an inner surface of the partition wall 41, and penetrates a bottom surface of the partition wall 41 to extend to the outside of the reactor 10.

A plurality of raw material gas outlets 31*f* are formed at a portion of the raw material gas supply pipe 31*a* located inside the reactor 10. A plurality of reactant gas outlets 32*f* are formed at a portion of the reactant gas supply pipe 32*a* located in the internal space P. Each outlet (raw material gas outlet 31*f* or reactant gas outlet 321) is formed at a predetermined interval in a direction in which each gas supply pipe extends. Each outlet discharges the gas in the horizontal direction. The interval between the respective neighboring outlets is set to be equal to, for example, the interval between the substrates W held in the boat 18. The position of each outlet in the height direction is set to an intermediate position between the substrates W adjacent to each other in the vertical direction. Thus, each outlet may efficiently supply the gas to opposing surfaces between the adjacent substrates W.

The gas supply 30 may blend a plurality of types of gases to discharge a blend of the gases from one supply pipe. For example, the raw material gas supply pipe 31*a* may be configured to be capable of discharging an inert gas to the inside of the reactor For example, the reactant gas supply pipe 32*a* may be configured to be capable of discharging the inert gas to the internal space P. The gas supply 30 may further include a supply pipe for supplying another gas, in addition to the raw material gas supply pipe 31*a* and the reactant gas supply pipe 32*a*.

The plasma generator 40 includes the partition wall 41, a first electrode 43, a second electrode 44, an RF power supply 46, and a shutter mechanism 47.

The partition wall 41 is provided at a part of the sidewall of the reactor 10. The partition wall 41 extends in a direction in which the plurality of substrates W are arranged. The partition wall 41 is airtightly welded to the sidewall of the reactor 10. The partition wall 41 has a recessed shape in the horizontal cross section. The partition wall 41 covers the opening 19 and defines the internal space P communicating with the inside of the reactor 10. The reactant gas supply pipe 32*a* is provided in the internal space P. The partition wall 41 is made of, for example, quartz.

The partition wall 41 includes sidewalls 41*a* to 41*e*, a bottom wall 41*f*, and a ceiling wall 41*g*. The sidewalls 41*a* and 41*b* extend in the radial direction of the reactor The sidewall 41*a* and the sidewall 41*b* are arranged opposite to each other. An outer end of the sidewall 41*a* and an outer end of the sidewall 41*b* are formed at the same distance positions from the center of the reactor 10. An inner end of the sidewall 41*a* is provided closer to the center of the reactor 10 than an inner end of the sidewall 41*b*. The sidewall 41*c* extends in the circumferential direction of the reactor 10, and is connected to the outer end of the sidewall 41*a* and the outer end of the sidewall 41*b*. The sidewall 41*d* extends in the circumferential direction of the reactor 10 and is connected to the inner end of the sidewall 41*a*. The sidewall 41*e* extends in the circumferential direction of the reactor 10 and is connected to the inner end of the sidewall 41*b*. A communication hole 41*h* is formed between the sidewall 41*d* and the sidewall 41*e*, through which the inside of the reactor 10 communicates with the internal space P. A length of the communication hole 41*h* in the vertical direction is the same as the length of the boat 18, or is longer than the length of the boat 18, so as to extend in the vertical direction. An inner surface 41*di* of the sidewall 41*d* is located closer to the center of the reactor 10 than an outer surface 41*eo* of the sidewall 41*e*.

The first electrode 43 has an elongated rectangular plate shape with the vertical longitudinal direction. The first electrode 43 is fixed to an outer surface of one sidewall of the partition wall 41 extending in the radial direction of the reactor 10. The first electrode 43 is connected to the RF power supply 46 via a power supply line 45 and a matching circuit (not illustrated). RF power is supplied from the RF power supply 46 to the first electrode 43.

The second electrode 44 has the same rectangular plate shape as the first electrode 43. The second electrode 44 is fixed to an outer surface of an opposing sidewall of the partition wall 41 extending in the radial direction of the reactor 10. The second electrode 44 is arranged opposite to the first electrode 43 with the partition wall 41 interposed therebetween, so as to constitute parallel flat-plate electrodes together with the first electrode 43. The second electrode 44 is connected to the RF power supply 46 via the power supply line 45 and the matching circuit (not illustrated). RF power is supplied from the RF power supply 46 to the second electrode 44.

The RF power supply 46 supplies RF power to the first electrode 43 and the second electrode 44. Thus, a capacitively coupled plasma (CCP) is generated from the reactant gas supplied to the internal space P between the first electrode 43 and the second electrode 44. The frequency of RF power is, for example, 13.56 MHz.

The shutter mechanism 47 opens and closes the communication hole 41*h*. The shutter mechanism 47 includes a shutter plate 47*a*, a pivot shaft 47*b*, a guide 47*c*, a seal 47*d*, and a sealing member 47*e*.

Figure 5:
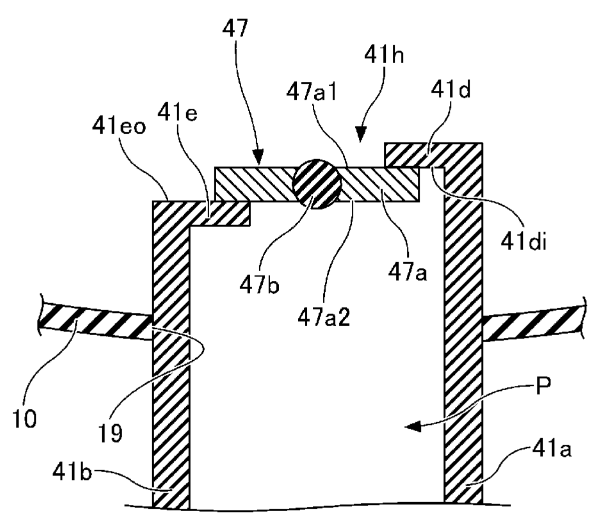
FIG. 5 is a view illustrating a closed state of a shutter plate.
Figure 6:
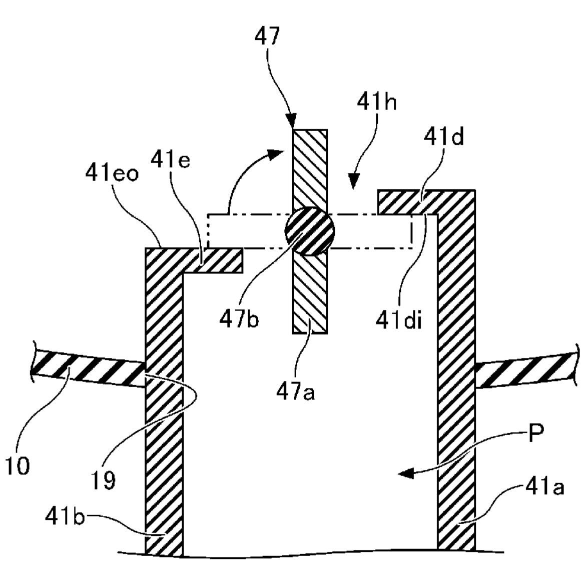
FIG. 6 is a view illustrating an open state of the shutter plate.
Figure 7:
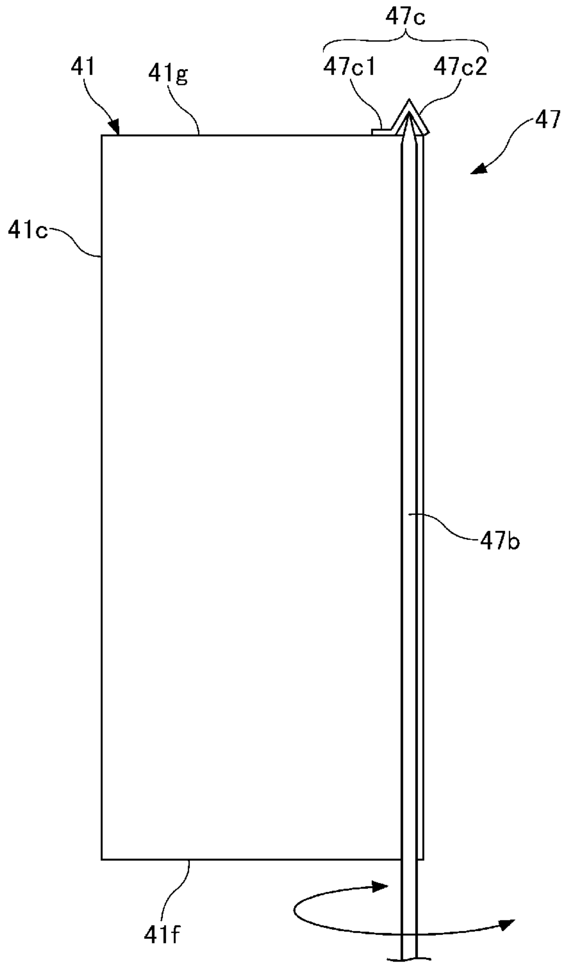
FIG. 7 is a longitudinal sectional view illustrating the example of the shutter mechanism.
Figure 8:
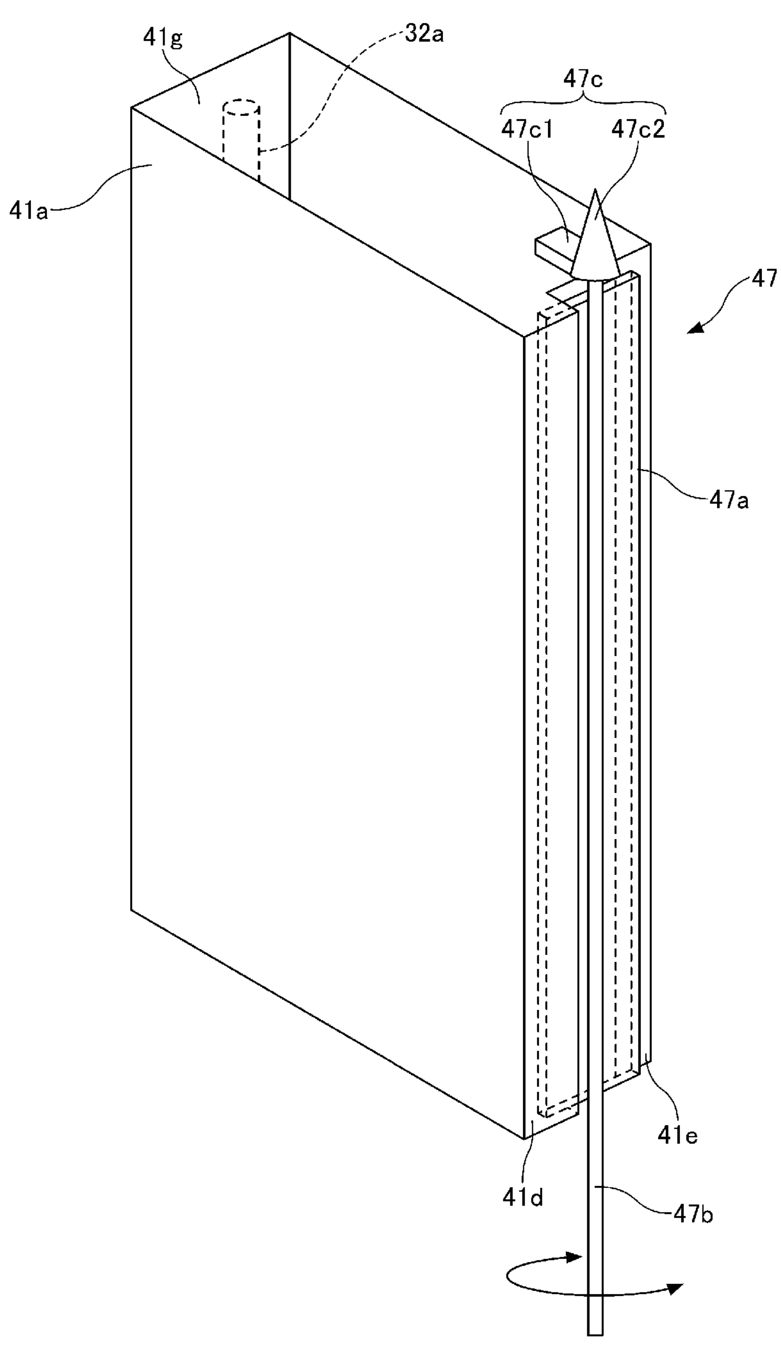
FIG. 8 is a perspective view illustrating the example of the shutter mechanism.
Figure 9:
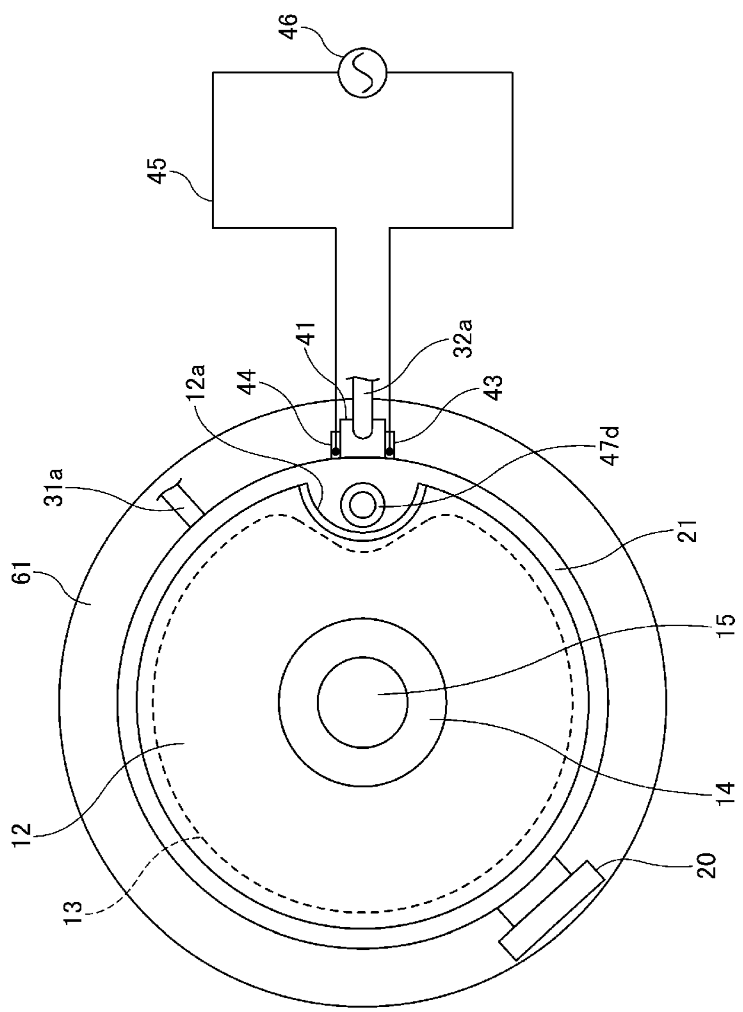
FIG. 9 is a view of the plasma processing apparatus seen from below.
Figure 10:
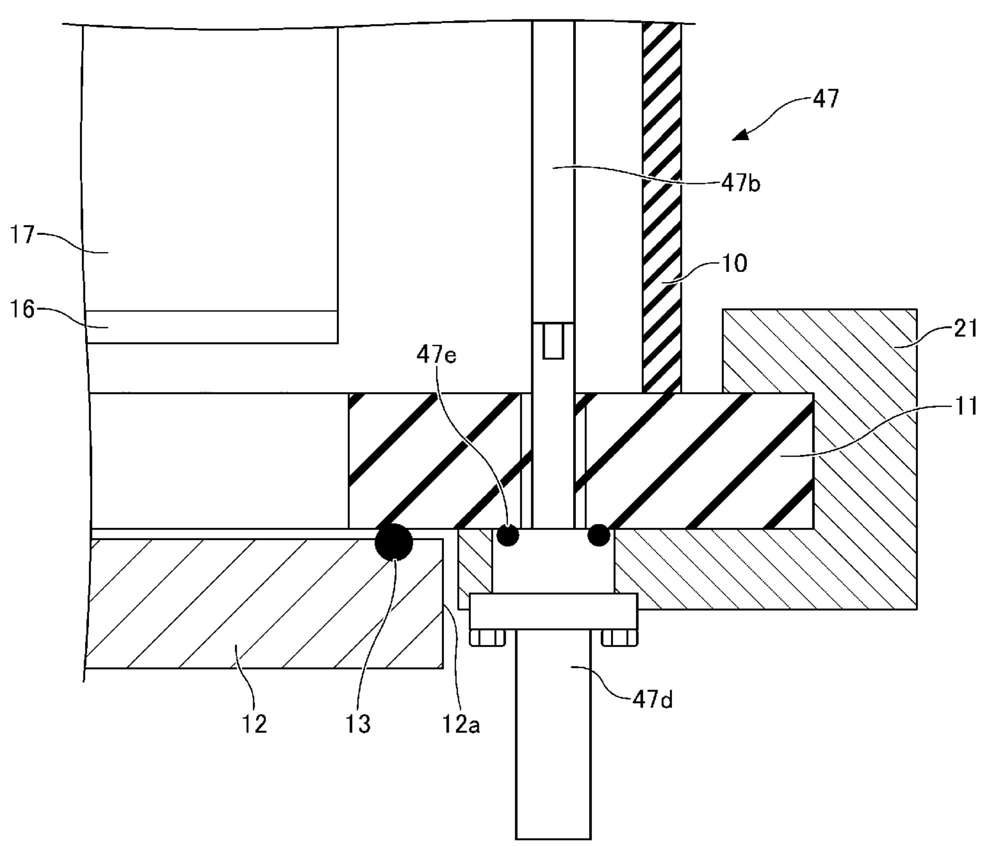
FIG. 10 is a view illustrating an example of a seal of the shutter mechanism.

The shutter plate 47*a* is fixed to the pivot shaft 47*b*. The shutter plate 47*a* pivots about the pivot shaft 47*b*, thereby opening and closing the communication hole 41*h* by. In this case, due to the simple operation of the shutter plate 47*a*, it is less likely for particles to be generated by the operation of the shutter plate 47*a*, in comparison to cases involving complex operations. The shutter plate 47*a* is made of, for example, quartz. The shutter plate 47*a* has a first surface 47*a*1 and a second surface 47*a*2 opposite to the first surface 47*a*1. For example, as illustrated in FIG. 5, the shutter plate 47*a* closes the communication hole 41*h* by coming into contact with the inner surface 41*di* of the sidewall 41*d* at the first surface 47*a*1 and coming into contact with the outer surface 41*eo* of the sidewall 41*e* at the second surface 47*a*2 opposite to the first surface 47*a*1. Thus, communication between the inside of the reactor 10 and the internal space P is blocked. For example, as illustrated in FIG. 6, the shutter plate 47*a* opens the communication hole 41*h* by pivoting clockwise about the pivot shaft 47*b* in a state of closing the communication hole 41*h*. Thus, the inside of the reactor 10 communicates with the internal space P through the communication hole 41*h*. In addition, in FIG. 6, the shutter plate 47*a* positioned to close the communication hole 41*h* is indicated by a two-dotted dash line, and the direction in which the shutter plate 47*a* rotates when opening the communication hole 41*h* is indicated by an arrow.

The pivot shaft 47*b* is provided in the communication hole 41*h* and extends in the vertical direction. An upper portion of the pivot shaft 47*b* is tapered, having a conical shape that narrows as it extends toward the tip. An upper end of the pivot shaft 47*b* is pivotably held by the guide 47*c*. A lower end of the pivot shaft 47*b* penetrates the bottom flange 11 through the seal 47*d* to extend to the outside of the reactor 10. The seal 47*d* is airtightly attached to the lower surface of the bottom flange 11 via the sealing member 47*e* such as an O-ring. The seal 47*d* is screwed to, for example, the metal flange 21. Thus, the sealing member 47*e* functions as a vacuum seal by being compressed and deformed. The lower end of the pivot shaft 47*b* is connected to a drive source (not illustrated), and rotates about a vertical rotation axis by the power of the drive source.

The guide 47*c* is fixed to an upper surface of the ceiling wall 41*g* and pivotably holds the upper end of the pivot shaft 47*b*. The guide 47*c* is made of, for example, quartz. The guide 47*c* has a fixing portion 47*c*1 and a retaining portion 47*c*2. The fixing portion 47*c*1 has a plate shape and is welded to the upper surface of the ceiling wall 41*g*. The retaining portion 47*c*2 is connected to the fixing portion 47*c*1 and has a hollow conical shape that widens from top to bottom. The retaining portion 47*c*2 pivotably holds the upper end of the pivot shaft 47*b* freely pivotably on a conical inner surface thereof. Since the retaining portion 47*c*2 has a hollow conical shape and the upper end of the pivot shaft 47*b* has a tapered conical shape, the contact area between the retaining portion 47*c*2 and the pivot shaft 47*b* is small, making it difficult for them to slide. Therefore, the generation of particles caused by pivoting of the pivot shaft 47*b* may be prevented.

The shutter mechanism 47 is not limited to a configuration in which the shutter plate 47*a* opens and closes the communication hole 41*h* by pivoting, and for example, may also have a configuration in which the shutter plate 47*a* opens and closes the communication hole 41*h* by horizontal movement. In this case, an outer surface of the sidewall 41*d* and an outer surface of the sidewall 41*e* may be in the same plane. The exhauster 50 includes an exhaust passage 51, a pressure adjusting valve 52, and a vacuum pump 53. The exhaust passage 51 is connected to the exhaust port 20. The exhauster 50 evacuates the inside of the reactor 10 by the vacuum pump 53 and adjusts the internal pressure of the reactor 10 by the pressure adjusting valve 52.

The heater 60 is provided around the reactor 10. The heater 60 includes a ceilinged cylindrical heater chamber 61 and a heater wire 62 spirally wound on an inner surface of the heater chamber 61. The heater 60 heats each substrate W accommodated inside the reactor 10 by heat generated from the heater wire 62.

The controller 90 performs a plasma processing method to be described later, for example, by controlling the operation of each part of the plasma processing apparatus 1. The controller 90 may be, for example, a computer. A computer program that executes the operation of each part of the plasma processing apparatus 1 is stored in a storage medium. The storage medium may be, for example, a flexible disk, compact disk, hard disk, flash memory, or DVD.

A description related to a plasma processing method performed using the plasma processing apparatus 1 according to the embodiment will be made with reference to FIG. 11. The plasma processing method according to the embodiment is performed by the controller 90 controlling the operation of each part of the plasma processing apparatus 1. In the following, a case of forming a titanium nitride (TiN) film, which is a conductive film, on the substrate W by plasma-enhanced atomic layer deposition (PEALD) as a plasma processing will be described by way of example. The TiN film is used as, for example, a conductive functional film such as vias, plugs, and contacts of semiconductor devices. The TiN film is used as, for example, a capacitor electrode in DRAM or as a contact barrier metal in DRAM, 3D NAND, and logic applications.

First, the boat 18 holding the plurality of substrates W is lifted from below the reactor 10 and is loaded into the reactor 10 which is adjusted in advance to a predetermined temperature, and the opening at the lower end of the reactor 10 is closed by the lid 12 to hermetically seal the inside of the reactor 10. Subsequently, the inside of the reactor 10 is evacuated by the exhauster 50 to be maintained at a process pressure, and the substrate temperature is raised by the heater 60 to be maintained at a process temperature. The boat 18 is rotated by rotation of the rotary shaft 15.

Figure 11:
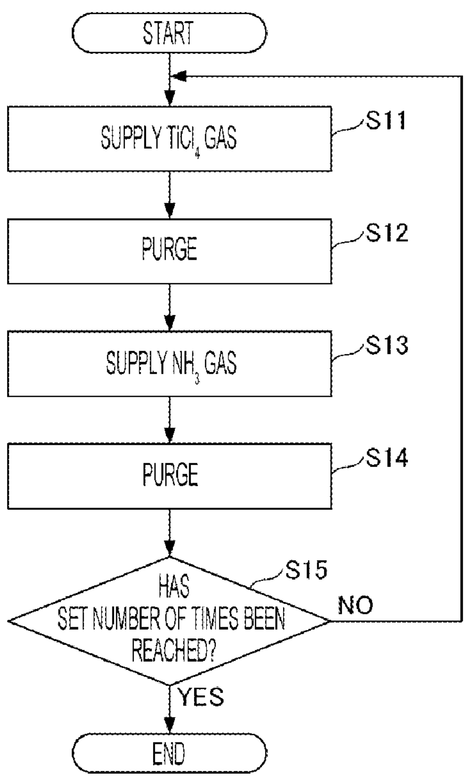
FIG. 11 is a flowchart illustrating an example of a plasma processing method according to the embodiment.

Next, the controller 90 performs steps S11 to S15 illustrated in FIG. 11 to form a TiN film on each substrate W.

In step S11, $TiCl_4$ gas is supplied to the inside of the reactor 10 from the raw material gas supply 31, so that the $TiCl_4$ gas is adsorbed onto each substrate W. In step S11, as illustrated in FIG. 5, the shutter plate 47*a* closes the communication hole 41*h* by pivoting to the closed position. Thus, the $TiCl_4$ gas supplied to the inside of the reactor 10 may be prevented from entering the internal space P. Therefore, deposition of the TiN film on the inner surface of the sidewall of the partition wall 41 may be prevented. It is difficult to completely seal the communication hole 41*h* by the shutter plate 47*a*, and there are cases where the $TiCl_4$ gas may move to the internal space P from the inside of the reactor 10 through a small gap. Hence, an inert gas may be supplied from the reactant gas supply 32 to the internal space P. In this case, the $TiCl_4$ may be prevented from entering the internal space P through the gap. The flow rate of the inert gas may be, for example, 300 sccm or more and 700 sccm or less.

Step S12 is performed after step S11. In step S12, while the inside of the reactor 10 is evacuated by the exhauster 50, the inert gas is supplied from the raw material gas supply 31 to the inside of the reactor 10. Thus, the $TiCl_4$ gas remaining inside the reactor 10 and in the internal space P is expelled. In step S12, the shutter plate 47*a* may be kept in the pivoted state to the closed position. In this case, the $TiCl_4$ gas remaining inside the reactor 10 may be prevented from entering the internal space P together with the inert gas. Therefore, deposition of the TiN film in the internal space P may be prevented. However, in step S12, the shutter plate 47*a* may pivot to the open position. In step S12, the inert gas may be supplied from the reactant gas supply 32 to the internal space P. In this case, the $TiCl_4$ gas may be prevented from entering the internal space P through the gap. In step S12, the evacuation of the inside of the reactor 10 by the exhauster 50 and the supply of the inert gas from the raw material gas supply 31 to the inside of the reactor 10 may be alternately performed.

Step S13 is performed after step S12. In step S13, NH 3 gas is supplied from the reactant gas supply 32 to the internal space P, and RF power is applied from the RF power supply 46 to the first electrode 43 and the second electrode 44, so that a plasma is generated from the NH 3 gas in the internal space P. In step S13, as illustrated in FIG. 6, the shutter plate 47*a* opens the communication hole 41*h* by pivoting clockwise to switch from the closed position to the open position. Thus, active species contained in the generated plasma diffuse from the internal space P to the inside of the reactor 10, causing the $TiCl_4$ gas adsorbed on each substrate W to be nitridated to form a TiN film. In step S13, the inert gas may be supplied from the raw material gas supply 31 to the inside of the reactor 10. In this case, the entry of active species into the raw material gas supply pipe 31*a* may be prevented. Therefore, deposition of the TiN film inside the raw material gas supply pipe 31*a* may be prevented.

Step S14 is performed after step S13. In step S14, while the inside of the reactor 10 is evacuated by the exhauster 50, the inert gas is supplied from the raw material gas supply 31 to the inside of the reactor 10, and the inert gas is also supplied from the reactant gas supply 32 to the internal space P. Thus, the NH 3 gas remaining inside the reactor 10 and the internal space P is expelled. In step S14, the shutter plate 47*a* may be kept in the pivoted state to the open position. In this case, the NH 3 gas remaining in the internal space P may be expelled. However, in step S14, the shutter plate 47*a* may pivot to the closed position. In step S14, the evacuation of the inside of the reactor 10 by the exhauster 50, the supply of the inert gas from the raw material gas supply 31 to the inside of the reactor 10, and the supply of the inert gas from the reactant gas supply 32 to the internal space P may be performed alternately. In step S14, the inert gas may be supplied from only one of the raw material gas supply 31 and the reactant gas supply 32.

Step S15 is performed after step S14. In step S15, it is determined whether or not steps S11 to S14 have been performed a set number of times. If the number of implementation times has not reached the set number of times (NO in step S15), steps S11 to S14 are performed again. Meanwhile, when the number of implementation times has reached the set number of times (YES in step S15), the film thickness of the TiN film has reached a target film thickness, so that the processing ends. In this way, the TiN film is formed on each substrate W by repeating steps S11 to S14 until the number of implementation times reaches the set number of times. The set number of times in step S15 is set according to, for example, the target film thickness of the TiN film. The set number of times in step S15 may be one time or several times.

As described above, according to the plasma processing apparatus 1 of the embodiment, the shutter mechanism 47 is provided to open and close the communication hole 41*h* through which the inside of the reactor 10 communicates with the internal space P. In this case, the communication hole 41*h* may be closed by the shutter mechanism 47 when supplying the $TiCl_4$ gas to the inside of the reactor 10 from the raw material gas supply 31. Thus, the $TiCl_4$ gas may be prevented from moving from the inside of the reactor 10 to the internal space P, so that the formation of the TiN film by a reaction of the $TiCl_4$ gas and the NH 3 gas may be prevented. Therefore, deposition of the TiN film on the inner surface of the sidewall of the partition wall 41 may be prevented. As a result, electrical insulation between the first electrode 43 and the second electrode 44 is maintained, so that discharge may be sustained in the internal space P. Consequently, in the batch type apparatus, a conductive film may be formed on the plurality of substrates W at once by PEALD.

For example, when forming a TiN film by PEALD, it is possible to shorten the time required to form a TiN film having a film quality equivalent to that of a TiN film formed by thermal ALD, or to lower a film formation temperature. Further, by forming the TiN film by PEALD at the same temperature as the film formation temperature when forming the TiN film by thermal ALD, the TiN film having a lower resistivity may be formed.

Meanwhile, a case where the shutter mechanism 47 is not provided is considered. In this case, when a conductive film is deposited on the inner surface of the sidewall of the partition wall 41 and the film thickness of the deposited conductive film exceeds a certain film thickness, the conductivity of the conductive film becomes closer to the conductivity of the plasma generated in the internal space P. Therefore, the RF power supplied to the parallel flat-plate electrodes is mainly consumed by the current flowing through the conductive film. Due to this, the insufficient RF power for generating the plasma in the internal space P makes it difficult for plasma discharge to occur in the internal space P before the conductive film formed on the substrate W reaches the target film thickness. That is, it becomes difficult to generate the plasma in the internal space P while the conductive film is being formed on the substrate W.

Specifically, it is assumed that the plasma density is $1\times10^{16}/m^3$ in a case where RF power having, for example, a frequency of 13.56 MHz and an output of 200 W is supplied between parallel flat-plate electrodes to generate a plasma from argon gas at 500° C. in the internal space P. The calculated resistance value of this plasma is 1.9Ω at 66.5 Pa. Meanwhile, it is assumed that a TiN film having the same film thickness is also deposited on the inner surface of the sidewall of the partition wall 41 in a case where a TiN film having a film thickness of 10 nm is formed on each substrate W by, for example, PEALD. Assuming that the resistivity of the TiN film having the film thickness of 10 nm is 100 μΩcm, the resistance value of the TiN film deposited on the inner surface of the sidewall of the partition wall 41, which short-circuits the parallel flat-plate electrodes at the shortest distance, is about 2.5Ω, which is close to the resistance value of plasma. It is assumed that the resistance value of plasma generated from ammonia gas is also close to the resistance value of plasma generated from the argon gas. In this case, the RF power supplied between the parallel flat-plate electrodes is mainly consumed by the current flowing through the TiN film deposited on the inner surface of the sidewall of the partition wall 41, making it difficult for plasma discharge to occur in the internal space P.

A description related to a plasma processing method performed using the plasma processing apparatus 1 according to the embodiment will be made with reference to FIG. 12. The plasma processing method according to the embodiment is performed by the controller 90 controlling the operation of each part of the plasma processing apparatus 1. In the following, a case of forming a silicon nitride (SiN) film as an insulating film on the substrate W by plasma ALD as a plasma processing will be described by way of example.

First, the boat 18 holding the plurality of substrates W is lifted from below the reactor 10 and is loaded into the reactor 10 which is adjusted in advance to a predetermined temperature, and the opening at the lower end of the reactor 10 is closed by the lid 12 to hermetically seal the inside of the reactor 10. Subsequently, the inside of the reactor 10 is evacuated by the exhauster 50 to be maintained at a process pressure, and the substrate temperature is raised by the heater 60 to be maintained at a process temperature. The boat 18 is rotated by rotation of the rotary shaft 15.

Figure 12:
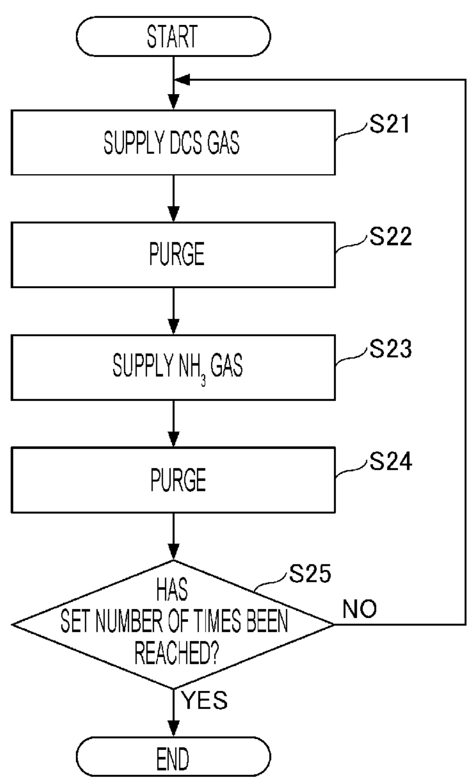
FIG. 12 is a flowchart illustrating another example of a plasma processing method according to the embodiment.

Next, the controller 90 performs steps S21 to S25 illustrated in FIG. 12 to form a SiN film on each substrate W.

In step S21, DCS gas is supplied to the inside of the reactor 10 from the raw material gas supply 31, so that the DCS gas is adsorbed onto each substrate W. In step S21, as illustrated in FIG. 5, the shutter plate 47*a* closes the communication hole 41*h* by pivoting to the closed position. Thus, the DCS gas supplied to the inside of the reactor 10 may be prevented from entering the internal space P. Therefore, deposition of the SiN film on the inner surface of the sidewall of the partition wall 41 may be prevented. As a result, particles derived from the SiN film deposited on the inner surface of the sidewall of the partition wall 41 may be reduced. It is difficult to completely seal the communication hole 41*h* by the shutter plate 47*a*, and there are cases where the DCS gas moves to the internal space P from the inside of the reactor 10 through a small gap. Hence, an inert gas may be supplied from the reactant gas supply 32 to the internal space P. In this case, the DCS may be prevented from entering the internal space P through the gap. The flow rate of the inert gas may be, for example, 300 sccm or more and 700 sccm or less.

Step S22 is performed after step S21. In step S22, while the inside of the reactor 10 is evacuated by the exhauster 50, the inert gas is supplied from the raw material gas supply 31 to the inside of the reactor 10. Thus, the DCS gas remaining inside the reactor 10 and in the internal space P is expelled. In step S22, the shutter plate 47*a* may be kept in the pivoted state to the closed position. In this case, the DCS gas remaining inside the reactor 10 may be prevented from entering the internal space P together with the inert gas. Therefore, deposition of the SiN film in the internal space P may be prevented. However, in step S22, the shutter plate 47*a* may pivot to the open position. In step S22, the inert gas may be supplied from the reactant gas supply 32 to the internal space P. In this case, the DCS may be prevented from entering the internal space P through the gap. In step S22, the evacuation of the inside of the reactor 10 by the exhauster 50 and the supply of the inert gas from the raw material gas supply 31 to the inside of the reactor 10 may be alternately performed.

Step S23 is performed after step S22. In step S23, NH 3 gas is supplied from the reactant gas supply 32 to the internal space P and RF power is applied from the RF power supply 46 to the first electrode 43 and the second electrode 44, so that a plasma is generated from the NH 3 gas in the internal space P. In step S23, as illustrated in FIG. 6, the shutter plate 47*a* opens the communication hole 41*h* by pivoting clockwise to switch from the closed position to the open position. Thus, active species contained in the generated plasma diffuse from the internal space P to the inside of the reactor 10, causing the DCS gas adsorbed on each substrate W to be nitridated to form a SiN film. In step S23, the inert gas may be supplied from the raw material gas supply 31 to the inside of the reactor 10. In this case, the entry of active species into the raw material gas supply pipe 31*a* may be prevented. Therefore, deposition of the SiN film inside the raw material gas supply pipe 31*a* may be prevented.

Step S24 is performed after step S23. In step S24, while the inside of the reactor 10 is evacuated by the exhauster 50, the inert gas is supplied from the raw material gas supply 31 to the inside of the reactor 10, and the inert gas is also supplied from the reactant gas supply 32 to the internal space P. Thus, the NH 3 gas remaining inside the reactor 10 and in the internal space P is expelled. In step S24 the shutter plate 47*a* may be particularly kept in the pivoted state to the open position. In this case, the NH 3 gas remaining in the internal space P may be expelled. However, in step S24, the shutter plate 47*a* may pivot to the closed position. In step S24, the evacuation of the inside of the reactor 10 by the exhauster 50, the supply of the inert gas from the raw material gas supply 31 to the inside of the reactor 10, and the supply of the inert gas from the reactant gas supply 32 to the internal space P may be performed alternately. In step S24, the inert gas may be supplied from only one of the raw material gas supply 31 and the reactant gas supply 32.

Step S25 is performed after step S24. In step S25, it is determined whether or not steps S21 to S24 have been performed a set number of times. If the number of implementation times has not reached the set number of times (NO in step S25), steps S21 to S24 are performed again. Meanwhile, when the number of implementation times has reached the set number of times (YES in step S25), the film thickness of the SiN film has reached a target film thickness, so that the processing ends. In this way, a SiN film is formed on each substrate W by repeating steps S21 to S24 until the number of implementation times reaches the set number of times. The set number of times in step S25 is set according to, for example, the target film thickness of the SiN film. The set number of times in step S25 may be one time or several times.

As described above, according to the plasma processing apparatus 1 of the embodiment, the shutter mechanism 47 is provided to open and close the communication hole 41*h* through which the inside of the reactor 10 communicates with the internal space P. In this case, the communication hole 41*h* may be closed by the shutter mechanism 47 when supplying the DCS gas to the inside of the reactor 10 from the raw material gas supply 31. Thus, the DCS gas may be prevented from moving from the inside of the reactor 10 to the internal space P, so that the formation of the SiN film by a reaction of the DCS gas and the NH 3 gas may be prevented. Therefore, deposition of the SiN film on the inner surface of the sidewall of the partition wall 41 may be prevented. As a result, particles derived from the SiN film deposited on the inner surface of the sidewall of the partition wall 41 may be reduced.

Meanwhile, a case where the shutter mechanism 47 is not provided is considered. In this case, the DCS gas supplied to the inside of the reactor 10 enters the internal space P through the communication hole 41*h*, and reacts with the NH 3 gas in the internal space P to form a SiN film. Therefore, the SiN film is deposited on the inner surface of the sidewall of the partition wall 41. When the film thickness of the deposited SiN film exceeds a certain film thickness, the amount of particles generated on each substrate W increases in proportion to the film thickness. Once a predetermined film thickness is reached to ensure that the amount of particles generated on each substrate W does not exceed a specified limit, a chamber cleaning is performed by dry cleaning to remove the SiN film deposited on the inner surface of the sidewall of the reactor 10 and on the inner surface of the sidewall of the partition wall 41. After the chamber cleaning is performed, the SiN film is formed again until a predetermined film thickness is reached.

The period from one chamber cleaning to the next chamber cleaning is referred to as a "dry cleaning cycle", and the length thereof is typically indicated in terms of a cumulative film thickness (nm). Recently, there has been a growing demand for improving the operating rate of the apparatus, and lengthening the dry cleaning cycle is considered important in terms of improving the operating rate of the apparatus.

When forming the SiN film by PEALD in the above-described plasma processing apparatus 1, the particles generated on the substrate W are often caused by the SiN film deposited on the inner surface of the sidewall of the partition wall 41. It is considered that a part of the SiN film deposited on the inner surface of the sidewall of the partition wall 41 is peeled off by the action of plasma generated in the internal space P and adheres to each substrate W as minute particles.

According to the plasma processing apparatus 1 of the embodiment, it is considered that the deposition of the SiN film on the inner surface of the sidewall of the partition wall 41 may be prevented, so that particles adhered to each substrate W may be reduced.

In the plasma processing apparatus 1 according to the embodiment, when the SiN film is formed by PEALD, it was possible to extend the dry cleaning cycle by more than 1.5 times under the same conditions when forming a SiN film in a plasma processing apparatus without providing the shutter mechanism 47.

According to the present disclosure, deposition of a film on a partition wall may be prevented.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
- a processing container having an opening in a sidewall;
- a partition wall configured to cover the opening and to define an internal space communicating with an inside of the processing container;
- a processing gas supply configured to supply a processing gas to the internal space;
- a pair of electrodes provided on outer surfaces of opposing sidewalls of the partition wall; and
- a shutter configured to open and close a communication hole through which the inside of the processing container communicates with the internal space, wherein:
- the shutter includes a shutter plate configured to pivot about a pivot shaft,
- an upper portion of the pivot shaft is tapered, having a conical shape that narrows as the upper portion of the pivot shaft extends toward a tip, and
- the shutter further includes a guide having a retaining portion with a hollow conical shape that pivotably holds the upper portion of the pivot shaft.

2. The plasma processing apparatus according to claim 1, wherein the shutter plate closes the communication hole by coming into contact with an inner surface of the partition wall at a first surface and coming into contact with an outer surface of the partition wall at a second surface opposite to the first surface.

3. The plasma processing apparatus according to claim 1, further comprising:
- a raw material gas supply configured to supply a raw material gas to the inside of the processing container; and
- a controller configured to control the shutter,
- wherein the controller is configured to control the shutter to close the communication hole when the raw material gas is supplied from the raw material gas supply.

4. The plasma processing apparatus according to claim 3, wherein the controller is configured to control the shutter to open the communication hole when the processing gas is supplied from the processing gas supply.

5. The plasma processing apparatus according to claim 1, wherein the processing container is configured to accommodate a plurality of substrates arranged in multiple tiers, and
- the partition wall extends in a direction in which the plurality of substrates are arranged.

6. The plasma processing apparatus according to claim 1, further comprising:
- a controller configured to supply an inert gas from the processing gas supply to the internal space when the communication hole is closed by the shutter, thereby preventing a raw material gas supplied to the inside of the processing container from entering the internal space.

7. The plasma processing apparatus according to claim 1, wherein at least one of the partition wall, the shutter plate, and the guide is made of quartz.

8. A plasma processing method comprising:
providing a plasma processing apparatus including:
a processing container having an opening in a sidewall;
a partition wall configured to cover the opening and to define an internal space communicating with an inside of the processing container;
a raw material gas supply configured to supply a raw material gas to the inside of the processing container;
a reactant gas supply configured to supply a reactant gas that reacts with the raw material gas, to the internal space;
a pair of electrodes provided on outer surfaces of opposing sidewalls of the partition wall; and
a shutter configured to open and close a communication hole through which the inside of the processing container communicates with the internal space,
wherein the shutter includes a shutter plate configured to pivot about a pivot shaft,
an upper portion of the pivot shaft is tapered, having a conical shape that narrows as the upper portion of the pivot shaft extends toward a tip, and
the shutter further includes a guide having a retaining portion with a hollow conical shape that pivotably holds the upper portion of the pivot shaft; and
supplying the raw material gas from the raw material gas supply in a state where the communication hole is closed by the shutter, thereby performing a plasma processing on a substrate accommodated in the processing container of the plasma processing apparatus.

9. The plasma processing method according to claim 8, further comprising supplying the reactant gas from the reactant gas supply in a state where the communication hole is opened by the shutter.

10. The plasma processing method according to claim 8, further comprising forming a conductive film on each substrate.

11. The plasma processing method according to claim 8, further comprising forming an insulating film on each substrate.

* * * * *